(12) United States Patent
Qian et al.

(10) Patent No.: US 11,889,659 B1
(45) Date of Patent: Jan. 30, 2024

(54) LIQUID-COOLED CASE AND COOLING CIRCULATORY SYSTEM

(71) Applicant: China Jiliang University, Hangzhou (CN)

(72) Inventors: Lijuan Qian, Hangzhou (CN); Zhitao Jiang, Hangzhou (CN); Chenlin Zhu, Hangzhou (CN); Fang Zhou, Hangzhou (CN); Zheng Wang, Hangzhou (CN)

(73) Assignee: China Jiliang University, Hangzhou (CN)

( * ) Notice: Subject to any disclaimer, the term of this patent is extended or adjusted under 35 U.S.C. 154(b) by 0 days.

(21) Appl. No.: 18/196,146

(22) Filed: May 11, 2023

(51) Int. Cl.
   *H05K 7/20* (2006.01)
   *G06F 1/20* (2006.01)

(52) U.S. Cl.
   CPC ........... *H05K 7/20272* (2013.01); *G06F 1/20* (2013.01); *H05K 7/20236* (2013.01)

(58) Field of Classification Search
   CPC .. G06F 1/20; H05K 7/20236; H05K 7/20272; H01L 23/473; H01L 23/4735
   See application file for complete search history.

(56) References Cited

U.S. PATENT DOCUMENTS

| | | | | |
|---|---|---|---|---|
| 5,915,463 A | * | 6/1999 | Romero | H05K 7/20909 174/16.3 |
| 8,416,572 B2 | * | 4/2013 | Olsen | H05K 7/2039 174/15.1 |
| 11,071,238 B2 | * | 7/2021 | Edmunds | H05K 7/20272 |
| 2020/0214169 A1 | * | 7/2020 | Tsunoda | H05K 7/20245 |

* cited by examiner

*Primary Examiner* — Zachary Pape
(74) *Attorney, Agent, or Firm* — Reising Ethington P.C.

(57) ABSTRACT

Provided is a liquid-cooled case which can disperse a cooling liquid by means of a jet cooling technique in an immersed system to dissipate heat uniformly and improve the heat dissipating efficiency. The liquid-cooled case includes cover plates; main boards; a liquid inlet unit, wherein the liquid inlet unit includes a liquid inlet tube and a liquid inlet, the liquid inlet is formed in the case, and one end of the liquid inlet tube is imported into the case through the liquid inlet; and a liquid outlet unit, wherein the liquid outlet unit includes a liquid outlet tube and a liquid outlet, the liquid outlet is formed in the case, and one end of the liquid outlet tube is exported out of the case through the liquid outlet. The liquid-cooled case further includes flow guide blocks which are arranged on the cover plates or the main boards.

8 Claims, 10 Drawing Sheets

LIQUID-COOLED CASE AND COOLING CIRCULATORY SYSTEM

CROSS-REFERENCE TO RELATED APPLICATIONS

This application claims priority to Chinese Patent Application No. 202211032027.X, filed on Aug. 26, 2022, which is hereby incorporated by reference in its entirety.

TECHNICAL FIELD

The present invention relates to the technical field of heat dissipation, and particularly relates to a liquid-cooled case and a cooling circulatory system.

BACKGROUND OF THE INVENTION

Emergence of data economy changes the mode of life of people fundamentally. Near all aspects (smart equipment, families, cities and autonomous vehicles) in daily life of people are dependent on tasks operated in data centers. However, in the fields of energy consumption, water consumption and area occupation and the like, high costs are needed to operate these data centers.

When there is an increasing number of chips which store and process data, there will be a lot of heat, which affects the operating speed of the computer. In the prior art, to improve the density of the chip, the chip is usually mounted on main boards arranged on both sides. However, it needs to remove all chips when the main boards in this structure are replaced, so that the maintenance cost is high. Moreover, the used heat dissipation mode is water cooling or air cooling, which cannot satisfy the heat dissipating demand of the components in the case. Furthermore, the case dissipating heat by water cooling has the potential safety hazard that electronic elements directly contact water, so that the using safety of the computer is reduced.

To solve the heat dissipation problem of electronic equipment, a common technical means is to place the electronic equipment in a nonconducting liquid for heat dissipation presently, for example, a single phase immersed liquid cooling technique. Heat generated by the electronic equipment is effectively transferred to the immersing liquid, so that the demand on common heat interfacial material, radiator, fan, protecting cover, metal plate and other parts in a conventional cooling method is reduced.

Chinese Patent Application CN114423264A discloses a single phase immersed liquid cooling system and a liquid cooling method. By arranging a flow adjusting unit on a liquid supply sub tube, the flow of a cooling liquid can be reflected through a pressure difference, so that the flow of the cooling liquid can be known accurately by measuring the pressure difference. Moreover, the flow of the cooling liquid can be regulated according to the pressure difference, which not only realizes demanded adjustment of the flow of the cooling liquid on each parallel branch in a circulating loop, but also is high in adjusting precision, thereby avoiding unbalance appearance of the flow of the cooling liquid.

Chinese Patent Application CN114364235A discloses liquid cooling equipment and a liquid cooling system, including at least one liquid cooling module. The liquid cooling module includes a cooling case, a liquid inlet branch and a liquid outlet branch. The liquid cooling case is configured to accommodate a cooling medium and a first heating part, the liquid inlet branch and the liquid outlet branch communicate with the cooling case respectively, and the liquid inlet branch is higher than the liquid outlet branch. The cooling module can package the heating part to be cooled in the cooling case and the circulating process of the external cooling medium in the cooling case is realized through the liquid inlet branch and the liquid outlet branch, so that the heating part is cooled. It can be seen that each liquid cooling module in the above liquid cooling equipment can be a relatively independent immersed cooling system. An immersed liquid cooling heating part can be arranged in the case without transforming an existing case greatly, which is beneficial to popularization and application of high power density parts.

By using the immersed liquid cooling system, the cooling liquid with less electrical insulating property and viscosity is used, so that the problem that the heat dissipating efficiency is low can be solved. With increasing improvement of electronic packaging density, liquid circulatory cooling is hard to satisfy the demands of cooling part of high power electronic equipment. Jet cooling has become a cutting-edge technology in the field of electronic cooling, which refers to atomizing a cooling medium and spraying it to an electronic assembly or chip needed to be cooled with a nozzle. The chip is usually coated with an insulating film, and the liquid is evaporated on a heat source to take away latent heat of vaporization.

BRIEF SUMMARY OF THE INVENTION

The present invention provides a liquid-cooled case which can disperse a cooling liquid in an immersed system by means of a jet cooling technique, so as to dissipate heat uniformly, thereby improving the heat dissipating efficiency. To solve the above technical problem, the embodiment of the present invention provides a liquid-cooled case which can disperse a cooling liquid by means of a jet cooling technique in an immersed system, so as to dissipate heat uniformly, thereby improving the heat dissipating efficiency. Specifically, the liquid-cooled case includes cover plates; main boards, wherein each main board includes a printed circuit board, a heating component and radiating fins; a liquid inlet unit, wherein the liquid inlet unit includes a liquid inlet tube and a liquid inlet, the liquid inlet is formed in the case, and one end of the liquid inlet tube is imported into the case through the liquid inlet; and a liquid outlet unit, wherein the liquid outlet unit includes a liquid outlet tube and a liquid outlet, the liquid outlet is formed in the case, and one end of the liquid outlet tube is exported out of the case through the liquid outlet. The liquid-cooled case further includes flow guide blocks which are arranged on the cover plates or the main boards.

According to some specific embodiments of the present invention, the projection of the flow guide block on the cover plate is cosinusoidal, cycloidal, parabolic, concave, square and triangular.

According to some specific embodiments of the present invention, the cosinusoidal projection satisfies an equation:

$$y_x = 102\cos\frac{pi}{360}x \ (0 < x < 180).$$

According to some specific embodiments of the present invention, the cycloidal projection satisfies an equation:

$$x_t = 180(t - \sin t),\ y_t = 180(1 - \cos t)\ \left(0 < t < \frac{pi}{2}\right).$$

According to some specific embodiments of the present invention, the parabolic projection satisfies an equation:

$$y_x = -\frac{17}{5400}x^2 + 102 \ (0 < x < 180).$$

According to some specific embodiments of the present invention, the density of the flow guide block is less than 2.0 kg/m³.

According to some specific embodiments of the present invention, the liquid inlet unit further includes a divided manifold, one end of the divided manifold is parallelly arranged at one end of the liquid inlet tube and is placed in the case, and the other end thereof is placed at the heating component.

According to some specific embodiments of the present invention, the end of the divided manifold away from the liquid inlet tube is round, duckbill and square.

According to some specific embodiments of the present invention, the case comprises at least two main boards which are in central symmetry relative to the center of the case.

According to some specific embodiments of the present invention, the radiating fins include fins, and the fins are cylindrical and rib-shaped.

Compared with that prior art, the technical solution of the embodiment of the present invention has the following beneficial effects:

First of all, in the present invention, the flow guide blocks are arranged on the cover plates away from the printed circuit boards for importing the cooling liquid to the heating component mounted on the main boards, and it usually cools the vicinity of the chip (for example, a central processing unit, a graphics processing unit, a sound card and a display card), which not only saves the cooling liquid and reduces the consumption, but also uniformly disperses the cooling liquid.

Then, the liquid inlet unit is provided with the divided manifold, one end of the divided manifold is arranged at one end of the liquid inlet and the divided manifold is placed in the case and the other end of the divided manifold is placed at the heating component, the liquid inlet tube communicates with each divided manifold, and the divided manifold can spray the cooling liquid to the surface of the heating component, which can solve the problem of non-uniform heat dissipation.

In addition, as the main boards mounted in center symmetry in the case, the processing cost and the maintenance cost are saved while the density of the electronic element is improved.

Further, the present invention further provides a cooling circulatory system, including the liquid-cooled case provided by the present invention, wherein the liquid outlet tube and the liquid inlet tube of the liquid-cooled case are tightly connected in series to a cooling device and a circulating device so as to form a close-looped circulatory system. The close-looped circulatory system can provide an overall heat dissipating solution, so that the cost is lowered.

BRIEF DESCRIPTION OF DRAWINGS

In order to make the above and other objectives, features and advantages of the present invention clearer and more comprehensible, the present invention will be further described below in combination with the drawings and specific embodiments. Those skilled in the art shall understand that the drawings are intended to schematically illustrate preferred embodiments of the present invention, and components in the drawings are not drawn to scale.

DESCRIPTION OF NUMERALS IN THE DRAWINGS

Figure 1:
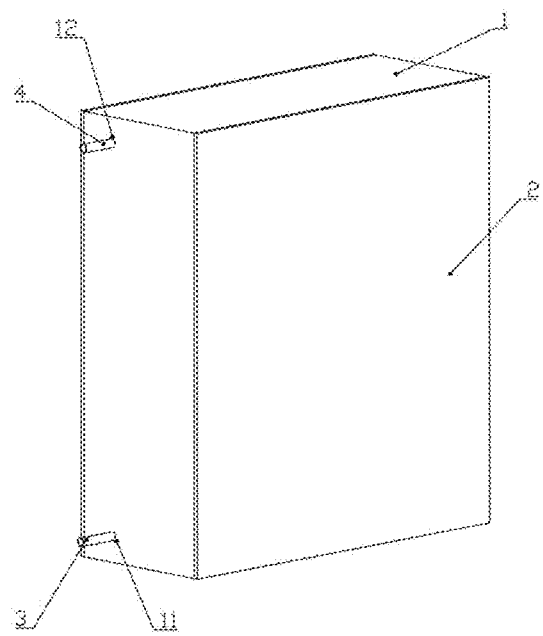
FIG. 1 is a schematic structural diagram of an immersed liquid-cooled case according to a specific embodiment of the present invention.

1—case; 11—liquid inlet; 12—liquid outlet;
2—cover plate; 21—main board; 22—radiating fin; 23—printed circuit board;
3—liquid inlet tube; 31—main tube; 32—divided manifold;
4—liquid outlet tube; 5—flow guide block.

DETAILED DESCRIPTION OF THE INVENTION

Some specific embodiments of the present invention will be described in detail below in combination with the drawings. It shall be understood that those skilled in the art are capable of imaging other embodiments according to teaching of the description and modifying the embodiments without departing from the scope or spirit of the disclosure. Therefore, the specific embodiments below are illustrative rather than restricted.

Unless otherwise specified, all figures used to represent feature sizes, quantities and physical properties in the description and claims shall be construed as being modified by the term "about". Therefore, unless otherwise stated, numerical parameters listed in the description and attached claims all are approximate values. Those of ordinary skill are capable of properly changing these approximate values to obtain needed characteristics according to teaching in the present invention. The numerical range represented by endpoints include all figures in the range, for example, 1-5 includes 1, 1.1, 1.3, 1.5, 2, 2.75, 3, 3.80, 4 and 5.

Unless otherwise specified, accessories used in the embodiment all are commercially available industrial products which can be purchased through commercial channels.

Liquid-Cooled Case

A liquid-cooled case shown in FIG. 1-4, including a case 1, and cover plates 2 hermetically connected to both sides of the case 1 respectively, wherein a closed cavity formed by the case 1 and the cover plates 2 is filled with a cooling liquid for heat transfer, and the cooling liquid features electric insulation and small viscosity.

A main board 21 located in the case is fixedly connected to the cover plate 2 on each side, and the main boards 21 are arranged in center symmetry about the center of the case 1. Four printed circuit boards 23 perpendicular to the corresponding main boards 21 are mounted of the main boards 21, a graphics processing unit (the heating component, the number of which is not shown in the drawings) is electrically connected to each printed circuit board 23; a central processing unit (the heating component, the number of which is not shown in the drawings) is electrically connected to the position of the main board 21 away from the printed circuit board 23, and radiating fins 22 are mounted on each central processing unit and each graphics processing unit. To achieve a better heat dissipating effect, although not shown in the drawings, fins on the radiating fins can be cylindrical, rib-shaped, so that the heat dissipating area increases. Those skilled in the art shall understand that to achieve the same technical effect, the position relation between the printed circuit boards 23 and the main boards 21 can also be non-perpendicular. The number of the printed circuit boards 23 mounted on the main boards 21 can be set according to actual demands, for example, 1, 2, 3 and the like. The numbers of the graphics processing units on the printed circuit boards 23, the central processing units on the main boards 21 or other heating components (such as sound cards, display cards) can be set as needed. For example, 2, 3 and 4 graphics processing units can be arranged on each printed circuit board 23, 2, 3 and 4 central processing units can be arranged on each main board 21, and not all feasible solutions are enumerated herein.

Figure 2A:
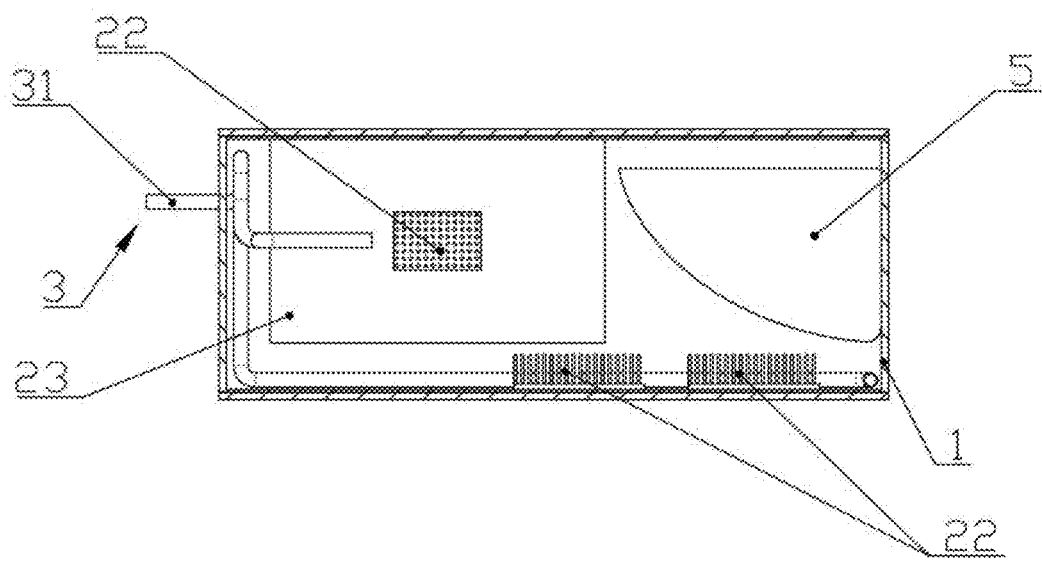
FIG. 2A-2B are schematic structural diagrams of an interior of the immersed liquid-cooled case according to the specific embodiment of the present invention.
Figure 2B:
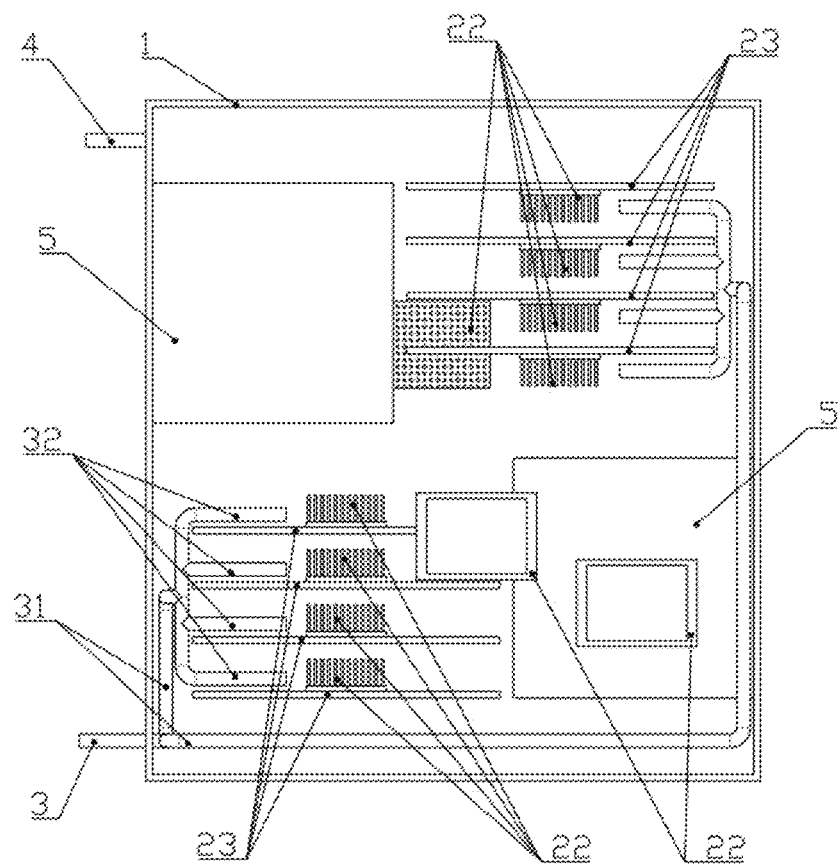
Figure 3:
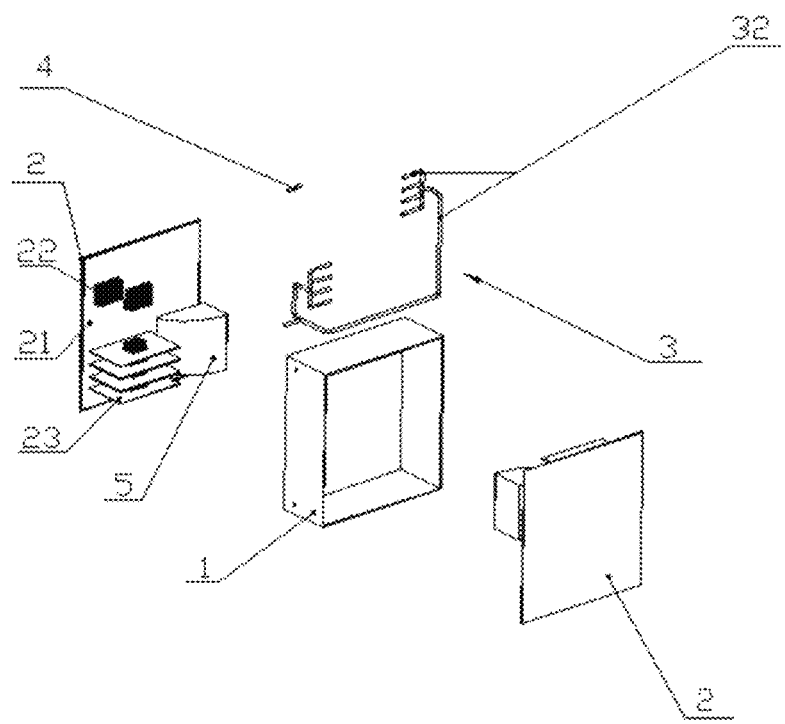
FIG. 3 is an exploded schematic structure diagram of the immersed liquid-cooled case according to the specific embodiment of the present invention.
Figure 4:
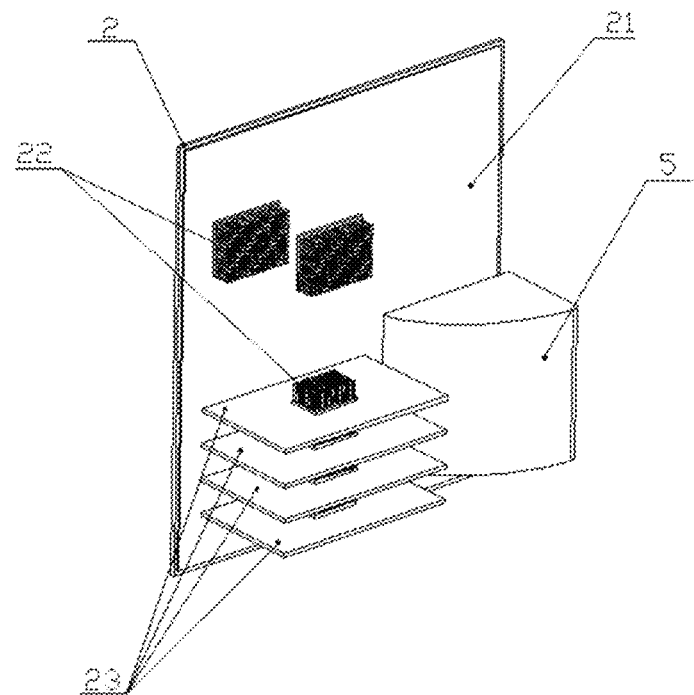
FIG. 4 is a partially schematic structural diagram of the immersed liquid-cooled case according to the specific embodiment of the present invention.

Flow guide blocks 5 are fixedly connected to the inner walls of the case 1 away from the printed circuit boards 23, and each flow guide block 5 can extrude the liquid sprayed by the divided manifold 32 to the position where the central processing unit is mounted; moreover, the flow guide blocks 5 occupy the volume of the case, which saves the cost of the cooling liquid. The flow guide block can be made from an insulating material such as polycarbonate, silica gel, polypropylene and polyethylene. The flow guide block can also made from a material with the overall density less than 2.0 kg/m$^3$, for example, a metal with an internal hollow structure, so as to guarantee low overall density and light weight of the flow guide block. As shown in FIG. 2B, two main boards 21 are arranged in center symmetry in the case 1, and two flow guide blocks 5 in the case 1 are arranged in center symmetry in the case 1.

The case 1 is provided with a liquid inlet 11 and a liquid outlet 12; the liquid outlet 12 is located above the liquid inlet 11; the case 1 is internally provided with a liquid inlet tube 3 hermetically and fixedly connected to the liquid inlet 11; and the liquid inlet tube 3 includes a main tube 31 and a divided manifold 32 with an end opening facing each radiating fin 22. An outlet of the divided manifold 32 can be round, duckbill, square and the like. The liquid inlet 11, the liquid inlet tube 3 and the divided manifold 32 form a liquid inlet unit (the number is not displayed in the drawings). The case 1 is internally provide with a liquid outlet tube 4 hermetically and fixedly connected to the liquid outlet 12, and the liquid outlet 12 and the liquid outlet tube 4 form a liquid outlet unit (the number is not displayed in the drawings).

In the embodiment shown in FIG. 1-4, the flow guide blocks 5 are arranged on the cover plates 2. Those skilled in the art shall understand that to achieve the same technical effect, the flow guide blocks 5 can also be arranged in corresponding positions of the main boards 21 for dispersing the cooling liquid, thereby playing a flow guiding role. The liquid inlet unit is provided with the divided manifold 32, one end of the divided manifold 32 is parallelly arranged at one end of the divided manifold 32 and the divided manifold 32 is placed in the case 1, the other end thereof is placed at the central processing unit or the graphics processing unit, the liquid inlet tube 3 communicates with each divided manifold 32, and the divided manifold 32 can spray the cooling liquid to the surface of the heating component, so as to solve the problem of non-uniform heat dissipation. In addition, as the main boards 21 mounted in center symmetry in the case 1, the processing cost and the maintenance cost are saved while the density of the electronic element is improved. Those skilled in the art shall understand that besides arrangement of the case with double main boards in center symmetry, a case with three symmetrical main boards and a liquid dividing tube can also be arranged according to actual demands. In a large computer system, a plurality of cases with double main boards in center symmetry or cases with three main boards can also be arranged.

Cooling Circulatory System

Figure 5:
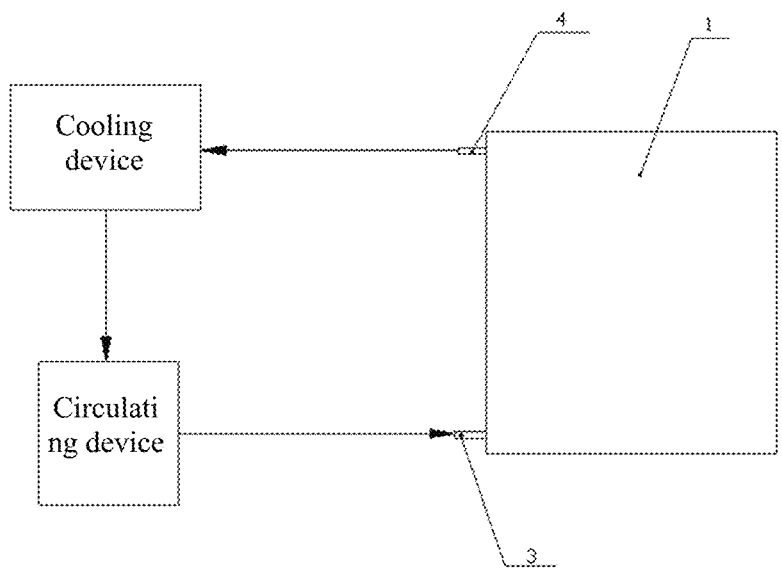
FIG. 5 is a schematic structural diagram of a cooling circulatory system according to the specific embodiment of the present invention.

As shown in FIG. 5, a circulating device and a cooling device are arranged outside the case 1 and are connected in series to the case to form a closed circulatory system. The closed circulatory system includes the cooling device hermetically connected to the liquid outlet tube 4 for cooling the cooling liquid to normal temperature and the circulating device, one end of which is hermetically connected to the cooling device and the other end of which is hermetically connected to the liquid inlet tube 3 for pumping the cooling liquid extracted from the cooling device into the case 1. The circulating device and the cooling device can be commercially available devices.

Before initial use, all devices do not work, and there is no liquid in the case 1.

During initial use, the circulating device and the cooling device are started. The cooling liquid is pumped into the case 1 through the liquid inlet tube 3; when there is the cooling liquid flowing out from the liquid outlet tube 4, the main boards 21 are powered, the case starts to work, chips such as the graphics processing units and the central processing units start to heat, and heat is conducted to the cooling liquid through the radiating fins; as the constant temperature cooling liquid is continuously sprayed from the divided manifold 32 to the radiating fins 22 horizontally, the temperature of the cooling liquid near the chips such as the graphics processing units and the central processing units is maintained at a relatively low temperature all the time, so that the heat exchange efficiency is greatly improved. As the high-temperature liquid is accumulated in the upper part of the case, the cooling liquid at relatively high temperature will flow out from the liquid outlet tube 4 above and enters the cooling device for circular use later.

When the device is stopped using, the device is shut down. After the temperature of the liquid in the case 1 is reduced to room temperature, the external circulatory system stops working, and is re-started next time.

The inventor discovers through research that the shapes of the flow guide blocks have certain influence on heat dissipating effect. When the projections of the flow guide blocks on the cover plates are cosinusoidal, cycloidal, parabolic, concave, square and triangular, the heat dissipating effect is better.

Specifically, the cosinusoidal projection satisfies an equation:

$$y_x = 102\cos\frac{pi}{360}x \ (0 < x < 180).$$

The cycloidal projection satisfies an equation:

$$x_t = 180(t - \sin t), \ y_t = 180(1 - \cos t) \ \left(0 < t < \frac{pi}{2}\right).$$

The parabolic projection satisfies an equation:

$$y_x = -\frac{17}{5400}x^2 + 102 \ (0 < x < 180).$$

As shown in FIG. 6A-6F, they are projection shapes of the flow guide blocks according to the specific embodiment of the present invention.

Figure 6A:
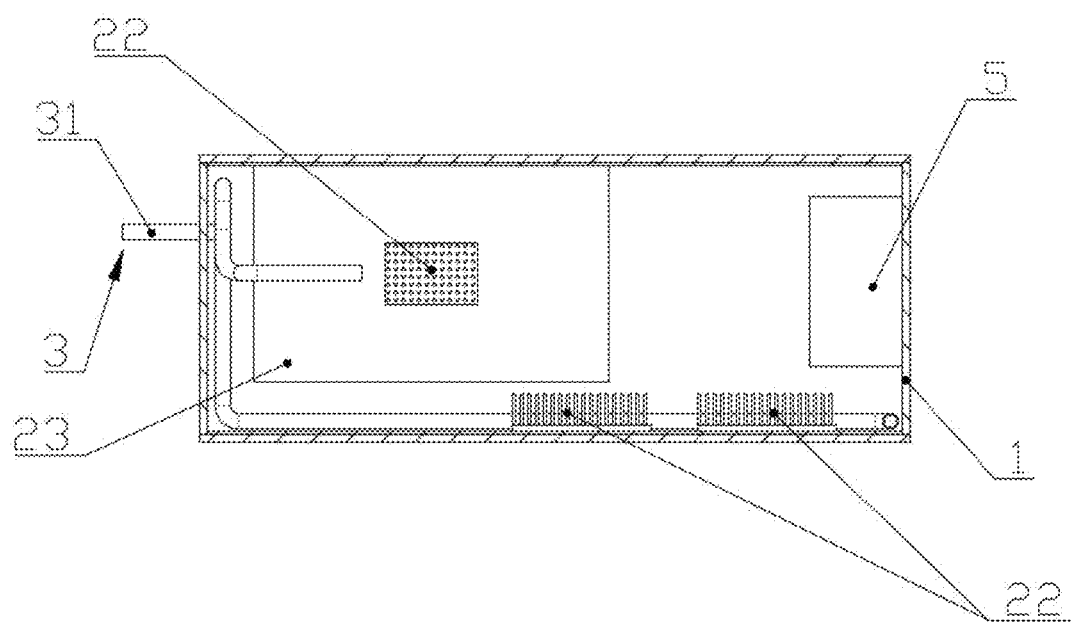
FIG. 6A-6F are schematic diagrams of shapes of flow guide blocks according to the specific embodiment of the present invention.
Figure 6B:
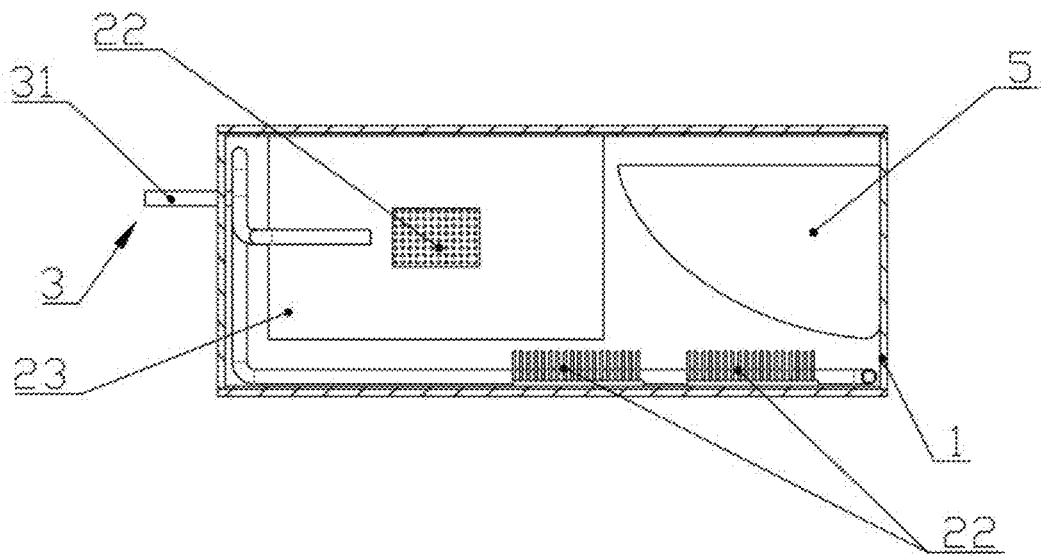
Figure 6C:
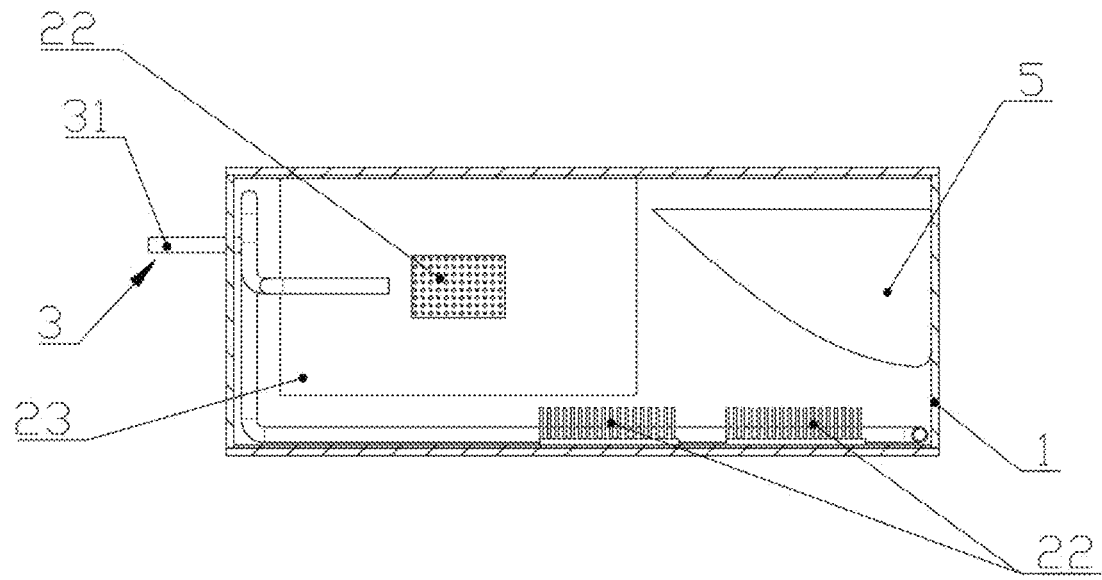
Figure 6D:
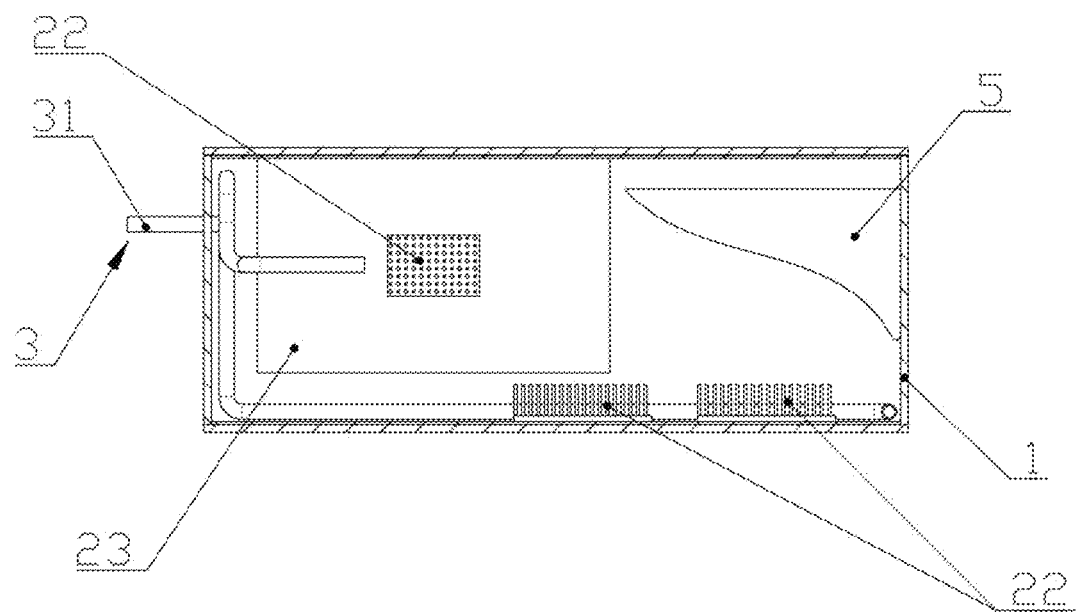
Figure 6E:
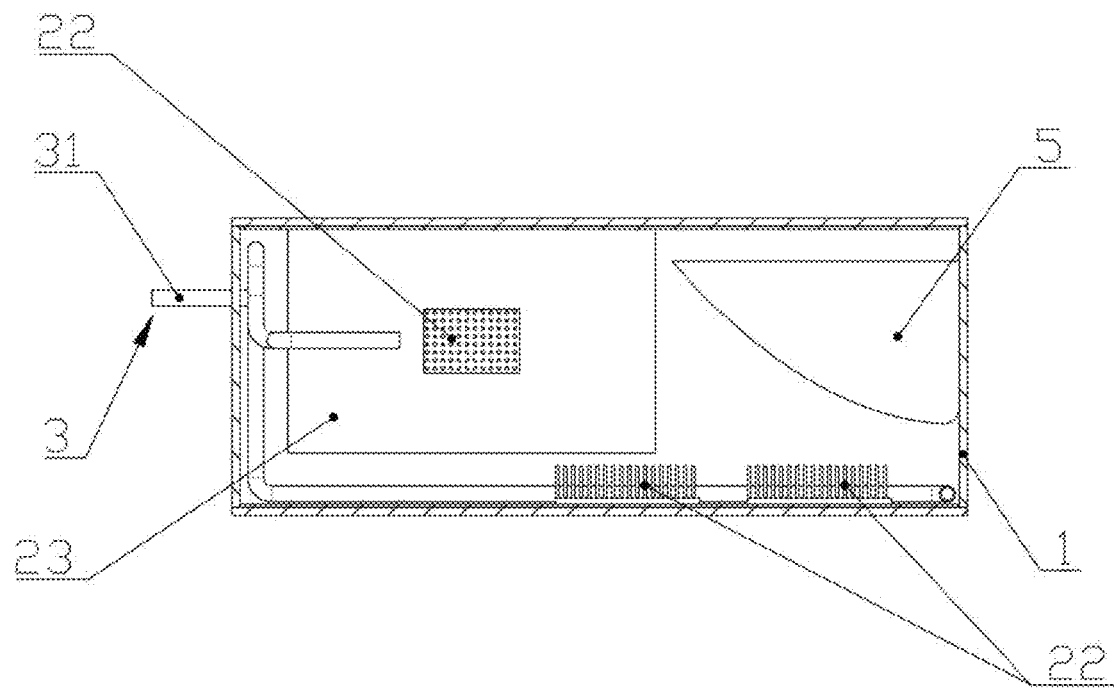
Figure 6F:
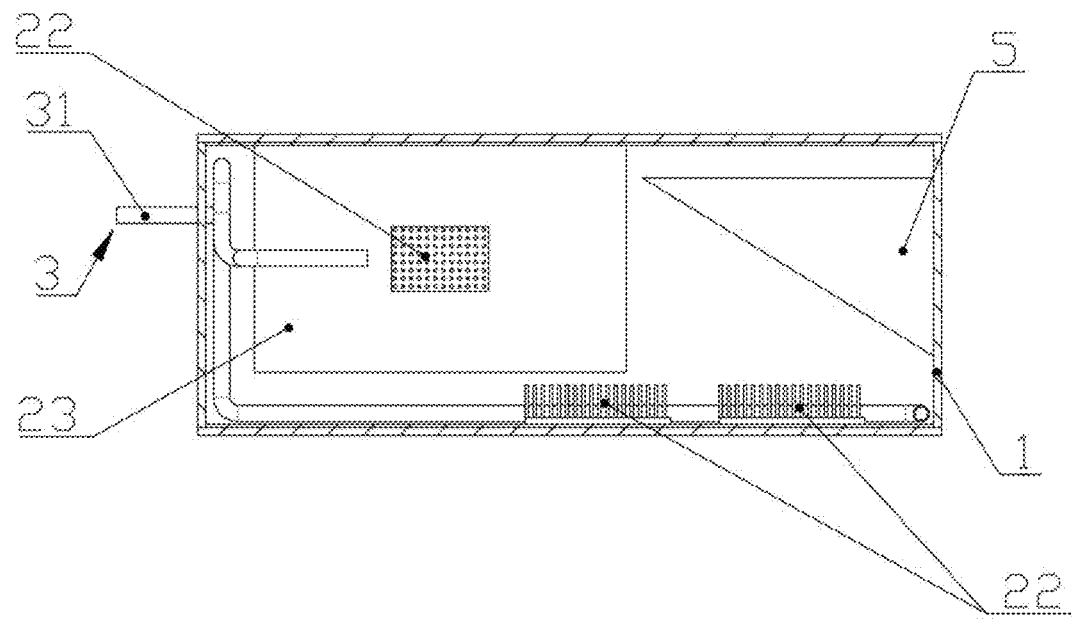

Embodiment 1: the projection shape of the flow guide block is square, as shown in FIG. 6A;

Embodiment 2: the projection shape of the flow guide block is cycloidal, as shown in FIG. 6B;

Embodiment 3: the projection shape of the flow guide block is cosinusoidal, as shown in FIG. 6C;

Embodiment 4: the projection shape of the flow guide block is concave, as shown in FIG. 6D;

Embodiment 5: the projection shape of the flow guide block is parabolic, as shown in FIG. 6E;

Embodiment 6: the projection shape of the flow guide block is linear, as shown in FIG. 6F.

Comparative Example: no flow guide blocks.

Test Method

The heat dissipating effect of the heating component in the case is evaluated through a simulation test in the present invention. The size of the case is designed as 500 mm×450 mm×176 mm, the size of the central processing unit is 75 mm×56.5 mm×2 mm, the radiating fins mounted on the central processing unit are common needle column radiating fins, and the substrate size of the central processing unit is 65 mm×90 mm×3 mm; the material of the chip (the heating component) is silicon (Si) in simulation software, with the power of 240 W, and the material of the radiating fins is copper (Cu); the mass flow rate of each divided manifold is 0.02 kg/s (the flow is 1.6 L/min); and the cooling medium used is a common FC-40 fluorinated solution in the market. Test data is recorded in Table 1.

TABLE 1

Test results of Embodiments 1-6 and Comparative Example

| | Projection shapes of the flow guide blocks | Surface speed of CPU1 (m/s) | Surface speed of CPU2 (m/s) |
|---|---|---|---|
| Example 1 | Square | 0.528 | 0.012 |
| Embodiment 2 | Cycloidal | 0.185 | 0.451 |
| Embodiment 3 | Cosine | 0.193 | 0.475 |
| Embodiment 4 | Concave | 0.192 | 0.431 |
| Embodiment 5 | Parabolic | 0.185 | 0.462 |
| Embodiment 6 | Linear | 0.169 | 0.428 |
| Comparative Example | No flow guide blocks | 0.063 | 0.433 |

Figure 7A:
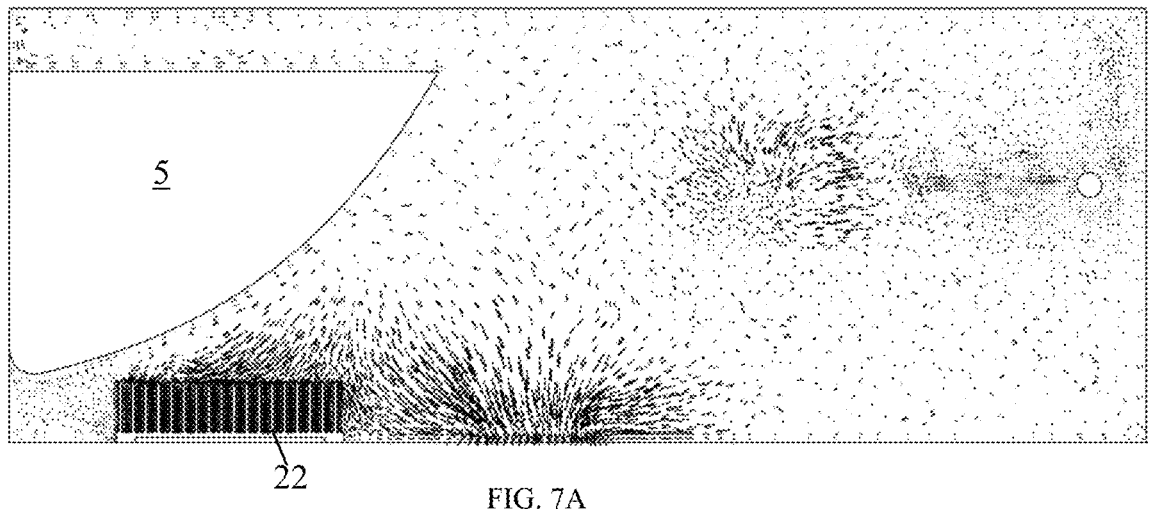
FIG. 7A-7C are heat dissipating simulation effect diagrams of the immersed liquid-cooled case (cycloidal flow guide blocks) according to the specific embodiment of the present invention.
Figure 7B:
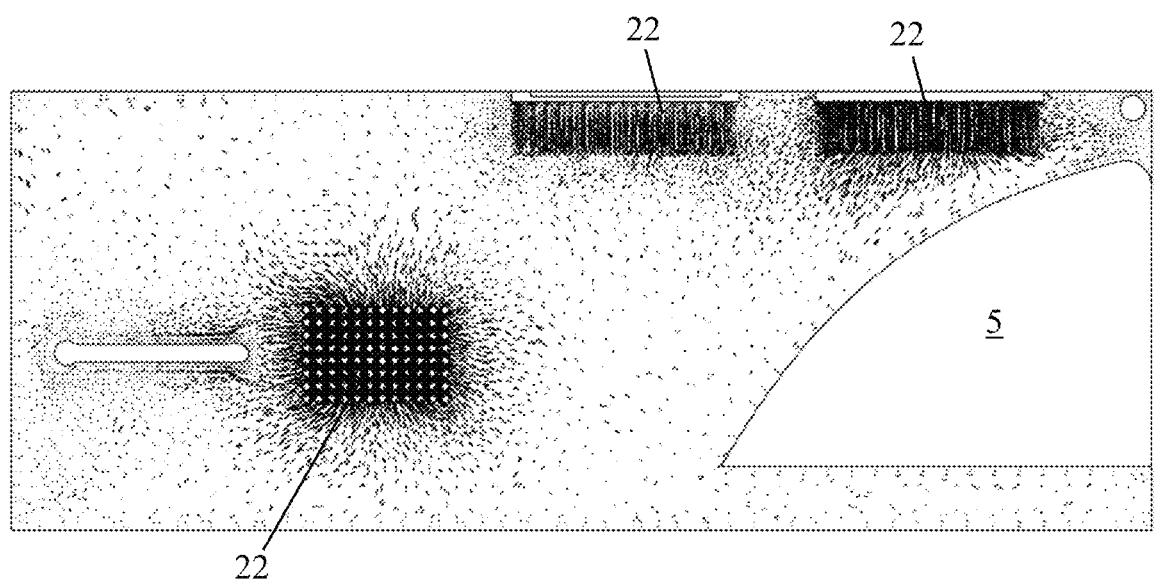
Figure 7C:
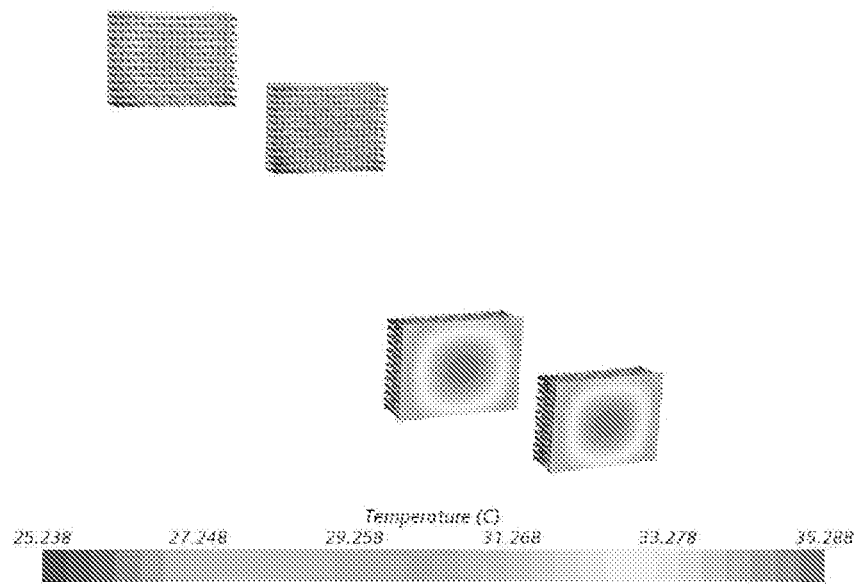
Figure 8A:
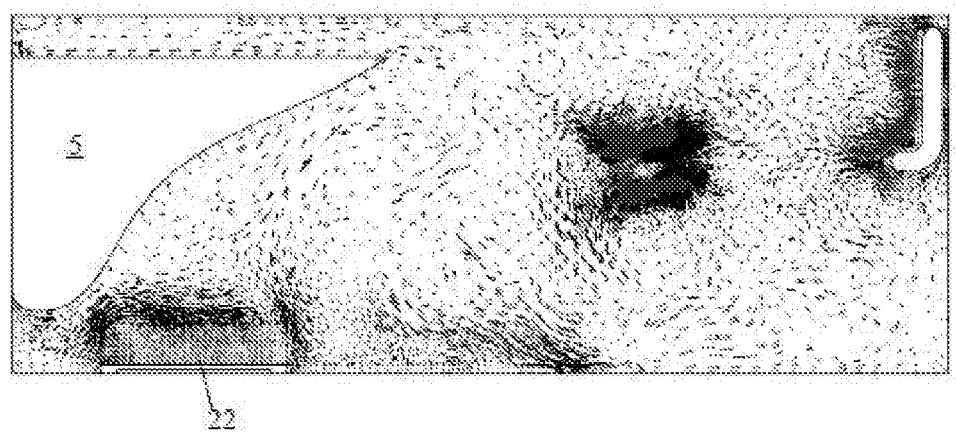
FIG. 8A-8B are heat dissipating simulation effect diagrams of the immersed liquid-cooled case (concave flow guide blocks) according to the specific embodiment of the present invention.
Figure 8B:
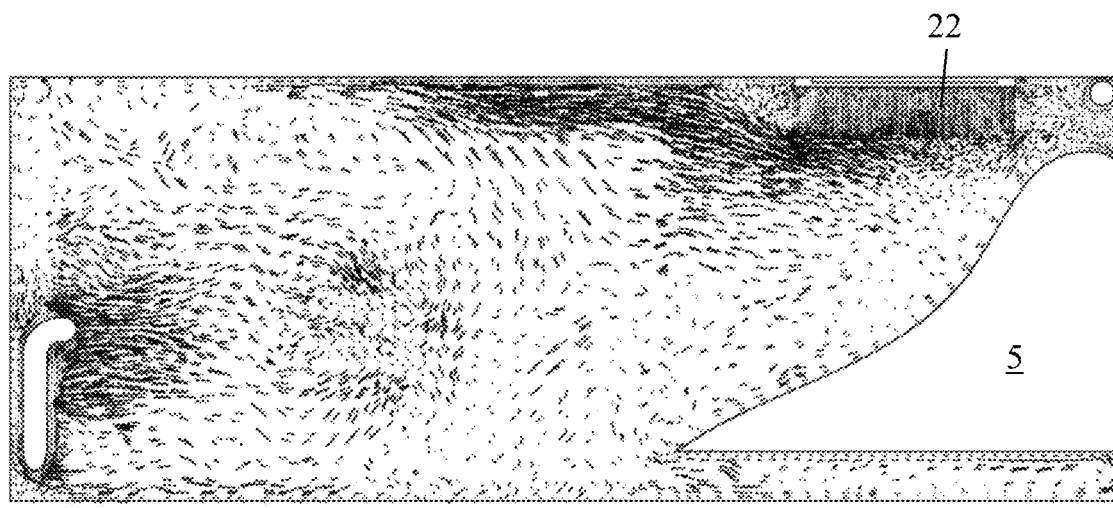
Figure 9A:
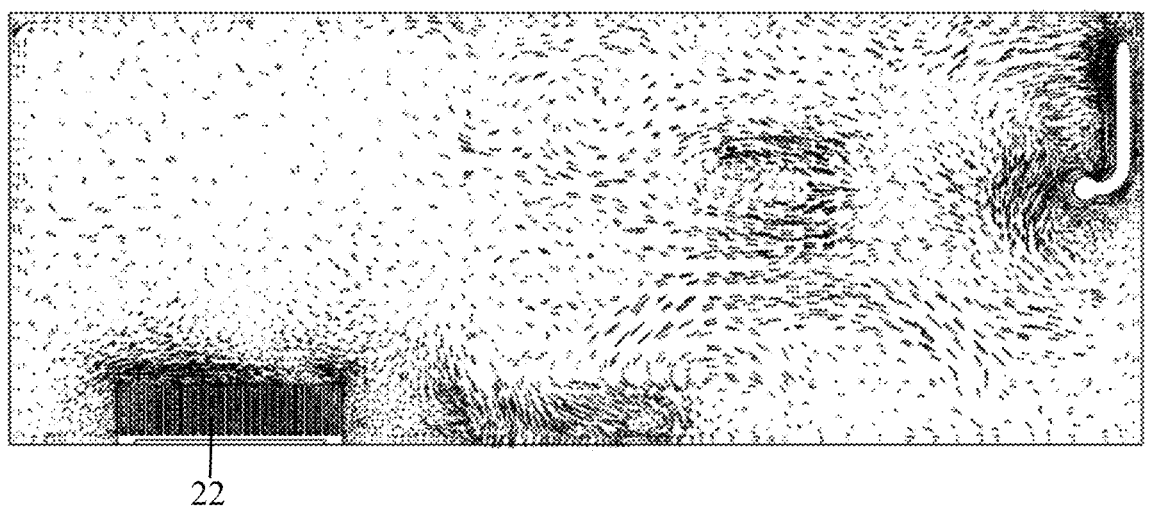
FIG. 9A-9C are heat dissipating simulation effect diagrams of the immersed liquid-cooled case (free of flow guide blocks).
Figure 9B:
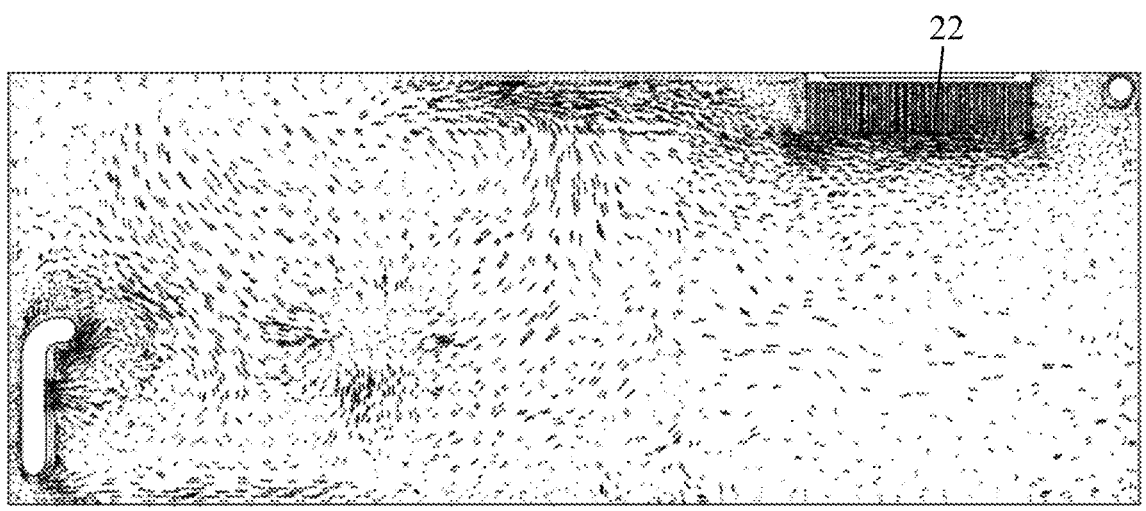
Figure 9C:
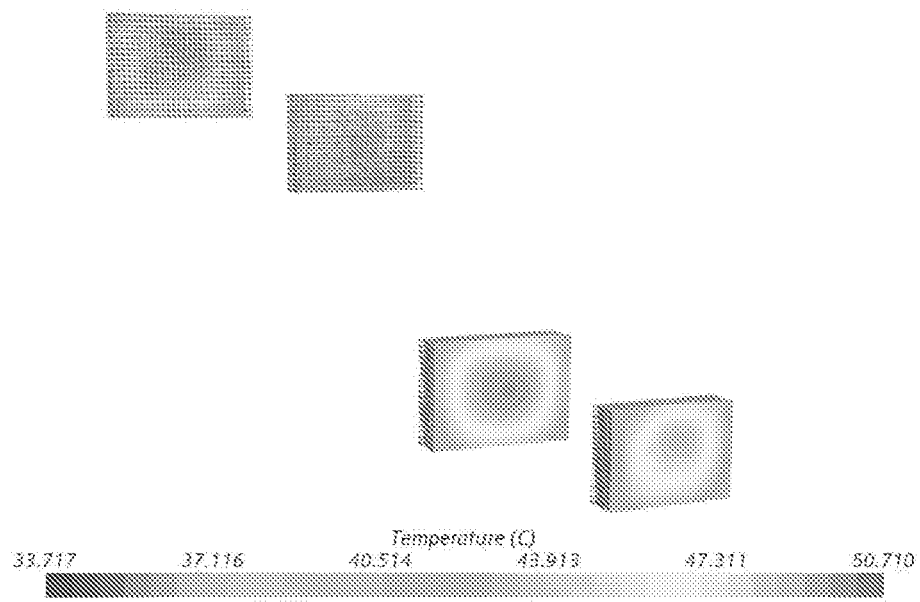

FIG. 7A-7C are heat dissipating simulation effect diagrams of the immersed liquid-cooled case (cycloidal flow guide blocks); FIG. 8A-8B are heat dissipating simulation effect diagrams of the immersed liquid-cooled case (concave flow guide blocks); FIG. 9A-9C are heat dissipating simulation effect diagrams of the immersed liquid-cooled case (free of flow guide blocks).

It can be known from the test results and the heat dissipating simulation effect diagrams shown in Table 1 that the case is internally provided with the flow guide blocks, and the vector direction of the cooling liquid will flow toward the radiating fins, so as to play roles of dispersing the cooling liquid, uniformly dissipating heat and improving the heat dissipating efficiency. With respect to the immersed liquid-cooled case without the flow guide blocks, the surface speeds of the CPU1 and the CPU2 are relatively low, so that the heat dissipating effect is poor.

Although the present invention is disclosed as above, it is not limited thereto. Any of those skilled in the art may make various alternations and modifications without departing the spirit and scope of the present invention. Therefore, the scope of protection of the invention should be subject to the scope of the invention as defined in the claims.

What is claimed is:

1. A liquid-cooled case, comprising:
   cover plates;
   main boards, wherein each main board comprises a printed circuit board, a heating component and radiating fins;
   a liquid inlet unit, wherein the liquid inlet unit comprises a liquid inlet tube and a liquid inlet, the liquid inlet is formed in the case, and one end of the liquid inlet tube is imported into the case through the liquid inlet; and
   a liquid outlet unit, wherein the liquid outlet unit comprises a liquid outlet tube and a liquid outlet, the liquid outlet is formed in the case, and one end of the liquid outlet tube is exported out of the case through the liquid outlet;
   wherein the liquid-cooled case further comprises flow guide blocks which are arranged on the cover plates or the main boards; and
   wherein the density of the flow guide blocks is less than 2.0 kg/m$^3$.

2. The liquid-cooled case according to claim 1, wherein the liquid inlet unit further comprises a divided manifold, one end of the divided manifold is parallelly arranged at one end of the liquid inlet tube and is placed in the case, and the other end thereof is placed at the heating component.

3. The liquid-cooled case according to claim 1, wherein the case comprises at least two main boards which are in central symmetry relative to the center of the case.

4. A cooling circulatory system, comprising the liquid-cooled case according to claim 1.

5. A liquid-cooled case, comprising:

cover plates;

main boards, wherein each main board comprises a printed circuit board, a heating component and radiating fins;

a liquid inlet unit, wherein the liquid inlet unit comprises a liquid inlet tube and a liquid inlet, the liquid inlet is formed in the case, and one end of the liquid inlet tube is imported into the case through the liquid inlet; and a liquid outlet unit, wherein the liquid outlet unit comprises a liquid outlet tube and a liquid outlet, the liquid outlet is formed in the case, and one end of the liquid outlet tube is exported out of the case through the liquid outlet;

wherein the liquid-cooled case further comprises flow guide blocks which are arranged on the cover plates or the main boards;

wherein the projection of the flow guide blocks on the cover plate is cosinusoidal, cycloidal, parabolic, concave, square and triangular.

6. The liquid-cooled case according to claim 5, wherein the cosinusoidal projection satisfies an equation:

$$y_x = 102\cos\frac{pi}{360}x \ (0 < x < 180).$$

7. The liquid-cooled case according to claim 5, wherein the cycloidal projection satisfies an equation:

$$x_t = 180(t - \sin t), \ y_t = 180(1 - \cos t) \ \left(0 < t < \frac{pi}{2}\right).$$

8. The liquid-cooled case according to claim 5, wherein the parabolic projection satisfies an equation:

$$y_x = -\frac{17}{5400}x^2 + 102 \ (0 < x < 180).$$

* * * * *